United States Patent

Mackay et al.

(10) Patent No.: US 9,542,263 B2
(45) Date of Patent: Jan. 10, 2017

(54) ELECTRONIC DEVICE HAVING A RUNTIME INTEGRITY CHECKER

(71) Applicants: Arthur Stuart Mackay, Prestwick (GB); Graham Edmiston, Bridge of Weir (GB)

(72) Inventors: Arthur Stuart Mackay, Prestwick (GB); Graham Edmiston, Bridge of Weir (GB)

(73) Assignee: NXP USA, INC., Austin, TX (US)

(*) Notice: Subject to any disclaimer, the term of this patent is extended or adjusted under 35 U.S.C. 154(b) by 132 days.

(21) Appl. No.: 14/494,767

(22) Filed: Sep. 24, 2014

(65) Prior Publication Data

US 2016/0085618 A1    Mar. 24, 2016

(51) Int. Cl.
*G06F 11/10* (2006.01)
*H03M 13/00* (2006.01)
*H03M 13/09* (2006.01)

(52) U.S. Cl.
CPC .......... *G06F 11/1004* (2013.01); *H03M 13/09* (2013.01)

(58) Field of Classification Search
CPC . H03M 13/09; G06F 11/1004; G06F 11/1068; G11C 29/028; G11C 29/12015; G11C 29/50012; G11C 29/14; G11C 2029/0405; G11C 29/44; G11C 29/4401; G11C 29/846; G11C 29/72; G11C 2029/1208; G11C 29/26; G11C 29/40; G11C 2029/0401; G11C 2029/2602
See application file for complete search history.

(56) References Cited

U.S. PATENT DOCUMENTS

| | | | | |
|---|---|---|---|---|
| 4,313,200 A | * | 1/1982 | Nishiura | G01R 31/31921 714/736 |
| 4,370,746 A | * | 1/1983 | Jones | G11C 29/56 714/718 |
| 5,210,839 A | * | 5/1993 | Powell | G06F 9/342 708/518 |
| 6,388,930 B1 | * | 5/2002 | Obremski | G11C 29/20 365/201 |
| 6,473,853 B1 | * | 10/2002 | Spiegel | G06F 9/4403 709/224 |
| 6,775,193 B1 | * | 8/2004 | Shyu | G11C 29/26 365/189.02 |
| 7,401,234 B2 | | 7/2008 | Case et al. | |
| 7,962,738 B2 | | 6/2011 | Zimmer et al. | |
| 8,051,299 B2 | | 11/2011 | Saunier | |
| 2004/0123137 A1 | | 6/2004 | Yodaiken | |
| 2005/0007841 A1 | * | 1/2005 | Nagata | G11C 29/44 365/200 |

(Continued)

*Primary Examiner* — Guerrier Merant

(57) ABSTRACT

An electronic device has a runtime integrity checker for monitoring contents of storage locations in an address range. The runtime integrity checker has a location selector for selecting the storage locations by generating addresses within the address range for locations to be checked, an interface unit coupled to the location selector for receiving the addresses for accessing the locations to be checked via a bus interface, and a processor coupled to the interface unit for retrieving the contents from the locations to be checked. A mask unit is provided for processing a mask for defining the locations to be checked based on bits in the mask. The hardware enables selective monitoring of non contiguous storage locations or data areas.

20 Claims, 7 Drawing Sheets

(56) References Cited

U.S. PATENT DOCUMENTS

| | | | |
|---|---|---|---|
| 2005/0055173 A1* | 3/2005 | Eustis | G11C 29/44 |
| | | | 702/118 |
| 2005/0193293 A1* | 9/2005 | Shikata | G11C 29/028 |
| | | | 714/718 |
| 2009/0276857 A1 | 11/2009 | Harkness | |
| 2010/0011444 A1 | 1/2010 | Yodaiken | |
| 2011/0022575 A1 | 1/2011 | Tomkins | |
| 2011/0083019 A1* | 4/2011 | Leppard | H04L 9/002 |
| | | | 713/189 |
| 2012/0198294 A1* | 8/2012 | Nadeau-Dostie | G11C 29/50012 |
| | | | 714/719 |
| 2013/0151914 A1* | 6/2013 | Cadigan | G06F 11/1068 |
| | | | 714/723 |
| 2014/0281354 A1 | 9/2014 | Tkacik et al. | |

\* cited by examiner

ELECTRONIC DEVICE HAVING A RUNTIME INTEGRITY CHECKER

FIELD OF THE INVENTION

This invention relates to an electronic device having a runtime integrity checker for monitoring contents of storage locations in an address range. The invention further relates to an integrated circuit comprising at least one such electronic device, a secure information processing system comprising at least one such electronic device and a method of monitoring contents of storage locations in an address range.

BACKGROUND OF THE INVENTION

The U.S. Pat. No. 7,401,234 describes an electronic device having an autonomous memory checker for runtime security assurance. Assuring code integrity of embedded systems software and safe operation of hardware blocks at runtime is becoming a significant security issue for an embedded electronic device.

During boot-time, an embedded processor may execute hardware and software initialization instructions to validate and configure the hardware and hardware related data in order to present a known execution environment and user interface for the system software. Once the boot-time instruction has checked for authenticity, the system control is passed to the validated runtime code, e.g. the operating system or application execution image, and enters the runtime mode.

During runtime, the processor executes the runtime code. It is during this latter stage, when the runtime environment is fully established, that it is possible for untrusted user application code or downloaded dynamic code to be run and for memory corruption to occur on the original trusted and authenticated code, due to non-boot-time factors such as computer viruses or internal programming bugs.

The autonomous memory checker in U.S. Pat. No. 7,401,234 comprises a controller, a memory reference file coupled to the controller, and an authentication engine coupled to the controller. A check is performed during runtime operation of the electronic device. The autonomous memory checker generates runtime reference values corresponding to trusted information stored in memory. The runtime reference values are compared against memory reference values stored in the memory reference file. The memory reference values are generated from the trusted information stored in memory. An error signal is generated when the runtime reference values are not identical to the memory reference values thereby indicating that the trusted information has been modified.

The autonomous memory checker is first set up by a host processor to define memory start addresses and blocks to be checked. The checker may also have the capability to monitor contents of registers in peripheral devices. The host processor may cooperate with the checker to receive and compare a hash value generated for a memory block by the checker.

A drawback of such a device is that the host processor is required to define the memory locations to be tested, and thereto defines address and length pairs, which are to be stored by the checker.

SUMMARY OF THE INVENTION

The present invention provides an electronic device, an integrated circuit, a secure information processing system comprising at least one such electronic device and a method of monitoring contents of storage locations in an address range as described in the accompanying claims.

Specific embodiments of the invention are set forth in the dependent claims. Aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

Elements in the figures are illustrated for simplicity and clarity and have not necessarily been drawn to scale. In the figures, elements which correspond to elements already described may have the same reference numerals.

DETAILED DESCRIPTION OF THE PREFERRED EMBODIMENTS

Figure 1:
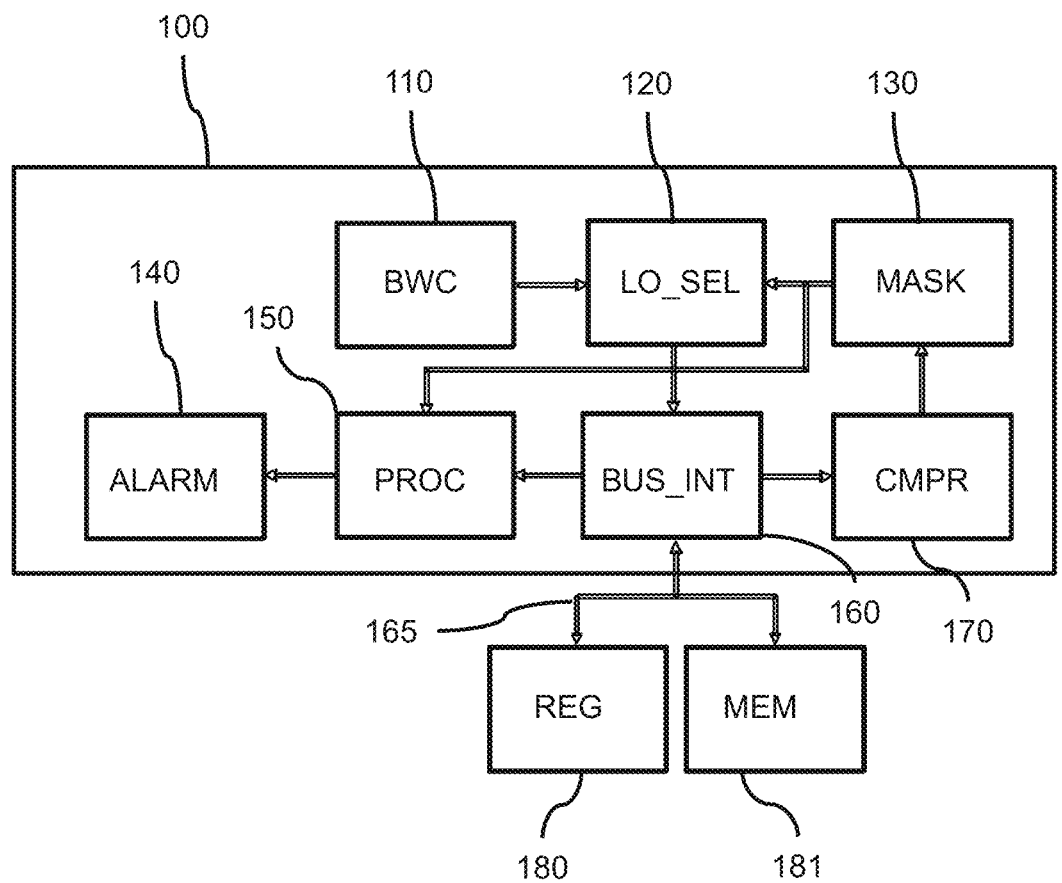
FIG. 1 shows an example of an electronic device having a runtime integrity checker.

In the examples in this document the electronic device is used in a digital processor designed for use in a secure information processing system, for example an industrial application called a Programmable Logic Controller (PLC), but the electronic device may be used in any other field requiring a secure data processing. Run Time Integrity Checking may be implemented in systems that need to ensure that running applications have not been altered since they were loaded. Such implementations may use a cryptogtraphic hash generated over areas of contiguous memory and may be limited to checking regions of program memory. It should be appreciated that the present invention is not limited to the specific processing architecture herein described with reference to the accompanying drawings, and may equally be applied to alternative architectures.

Secure data processing, for example avionics and safety critical applications, may require monitoring further storage locations like registers of hardware blocks that store a combination of static and dynamic data. Software may be used for further integrity checking. For example, if a program stores a value into a register and it is not expected to change, the software may periodically check that this register remains at the correct value, e.g. if a register sets the DDR refresh rate at a particular period then it is possible for data corruption to occur if this value is erroneously or maliciously altered to a longer refresh period. However, software consumes processor resources and since it executes as software it is not as secure as a hardware implementation. The description below provides various alternatives.

Existing systems may assume that the areas to be checked are defined in individual descriptors. The areas are expected to be contiguous areas of memory locations that will not change, e.g. instruction memory or constant data. Within the individual memory locations the entire data is subjected to the test. This doesn't allow specific areas of the region or bits within specific locations to be selectively tested or omitted from the integrity check. Below a mask is described to define the locations to be checked by a hardware integrity checker. Where entire locations are to be omitted the integrity checker may skip reading these locations at all which reduces the bandwidth required for checking on a system bus via which the storage locations are accessible.

The mask for a region to be checked may be created by taking the register definitions, e.g. the addresses in the address range of the region to be checked, and populating the mask by a 1 in bit locations that are not expected to change and a 0 in bit locations that are expected to change or are not implemented. The integrity checker may operate in parallel with existing hardware processes or test engines that check the entire region over a programmed period of time, and may contribute to an integrity hash. Any modification of the data or failure of the integrity check to complete may cause an exception to be raised by a processor that controls the monitoring.

FIG. 1 shows an example of an electronic device having a runtime integrity checker. The runtime integrity checker 100 has an interface unit BUS_INT 160, which is coupled via an interface bus 165 to storage locations 180,181, for example registers REG 180 and a memory MEM 181. The runtime integrity checker has a location selector LO_SEL 120, a mask unit MASK 130 and a processor PROC 150. The location selector is for selecting the storage locations by generating addresses within an address range for locations to be checked. The interface unit 160 is coupled to the location selector for receiving the addresses for accessing the locations to be checked via the interface bus. The processor 150 is coupled to the interface unit for retrieving the contents from the locations to be checked. The mask unit is for processing a mask for defining the locations to be checked based on bits in the mask. The runtime integrity checker may further have a bandwidth control unit BWC 110 for controlling the amount of bus bandwidth that is used by the runtime integrity checker, e.g. by controlling the number of locations that is accessed per second. The runtime integrity checker may further have an alarm unit ALARM 140 for generating an alarm signal or an interrupt for other units in the electronic device.

The mask unit receives the mask as retrieved from a memory via the bus interface, or via any other medium. The mask may also be preprogrammed in the mask unit. The mask unit now processes the mask so as to control which storage locations are to tested, and/or which bits within the storage locations are to be tested. Generally test results are based on the contents of the register data and the mask, e.g. based on a logical AND of mask entries and contents of the storage locations being tested, and may be sent to the processor for further processing, e.g. calculating a checksum or hash value.

In an embodiment of the electronic device, the mask unit 130 is coupled to the location selector 120 for defining the locations to be checked by providing the addresses of the locations to be checked based on bits in the mask. The mask unit may translate the mask bits into non contiguous addresses within the address range to be checked.

In an embodiment of the electronic device, the mask unit is coupled to the processor for defining the locations to be checked by defining respective bits of contents of a location to be checked based on bits in the mask. The mask unit may translate the mask bits into respective bits within a location to be checked.

In an embodiment of the electronic device, the mask is indicating for respective bits of a location to be checked whether the respective bit is to be tested or ignored and the mask unit is arranged for testing only the respective bits of the contents based on the mask. For example, the mask bit value 0 may indicate that the corresponding bit is to be ignored.

In an embodiment of the electronic device, the mask is indicating that a respective location in an address range of locations to be tested does not contain any bits to be tested. The mask unit is arranged for skipping the respective storage location based on the mask, where the mask is indicating that a respective location in an address range of locations to be tested does not contain any bits to be tested. For example, a mask entry having only values 0 may indicate that the corresponding storage location is to be skipped.

In an embodiment, the runtime integrity checker has a mask decompress unit CMPR 170 for decompressing a mask file to retrieve the mask. The mask decompress unit would be used to de-compress a mask file to retrieve the mask. After generating the mask would first be compressed and then stored in the mask file. Thereby storing the compressed mask requires less memory space.

The electronic device including the runtime integrity checker may be implemented as an integrated circuit. Such an integrated circuit may also contain several runtime integrity checkers as described above. Also a secure information processing system may contain at least one electronic device including the runtime integrity checker as described above.

In practice, the runtime integrity checker may include a hardware block that runs a hash over a predefined area of contiguous memory, and may have the capability of determining the amount of bandwidth it can use to complete the run over the entire block. The mask may be used to check non contiguous memory areas or locations. If the mask file indicates that the register or location being accessed does not contain any static data then no external access need be issued allowing skipping over unimplemented regions of register space. If the mask file indicates that a location contains static data then the location is read and the contents sent to the hash engine. The data is subjected to a logical AND with the mask value in the mask file for this location. The mask may identify that a register contains both static and dynamic data allowing dynamic data to be masked off.

Figure 2:
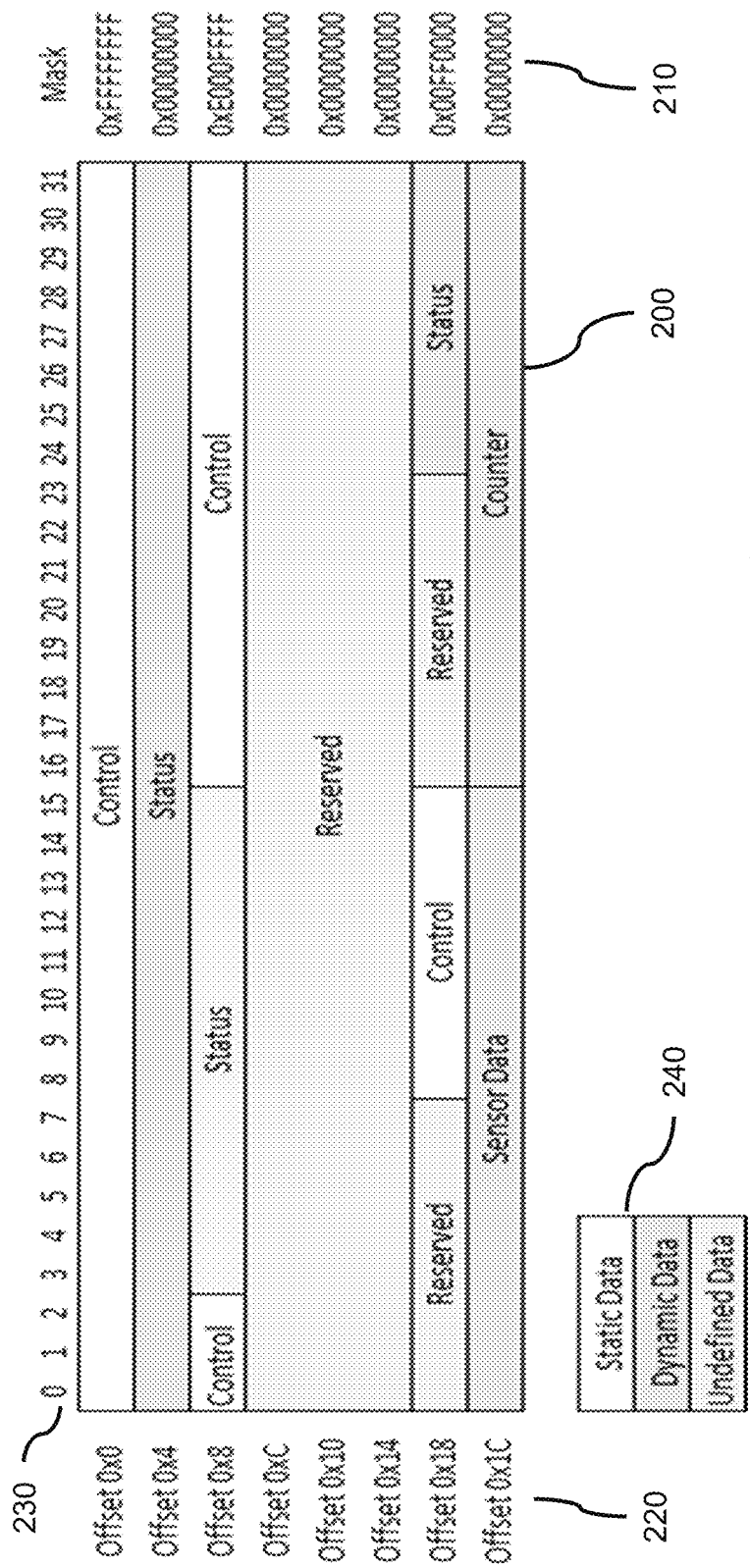
FIG. 2 shows an example of storage locations in an address range and a mask.

FIG. 2 shows an example of storage locations in an address range and a mask. The Figure shows a register space 200 in an address range 220, respective registers and other locations having text labels, such as Control, Status, etc. A mask 210 is indicated corresponding to the storage locations in the address range. Respective bits 230, numbered 0-31, are indicated for each respective address. Static data is found in the register space labeled Control; dynamic data is found in register space labeled Status, Sensor Data, Counter. Undefined data is found in locations marked Reserved. The mask reflects the data type in that the mask contains a 0 for each bit that is dynamic or undefined data, which is not to be tested.

The Figure gives an example of how register space is typically implemented. Registers may contain Static Data which governs how the relevant block is configured, Dynamic Data which may consist of status information of the relevant block or data that represents the state of an external input. The Undefined Data is either unimplemented register space or contains information about the internal state of the block, which may vary in any unpredictable way. Register blocks may contain logic that generates exceptions when status bits change, which allows a running application to recognize events occurring. However, register blocks do not contain logic to recognize when the block configuration has changed, so the runtime integrity checker provides a function to monitor such changes.

In the example of FIG. 2 there are 8 registers that are 32 bits wide. The register at offset 0x0 consists entirely of static data, the register at offset 0x4 consists entirely of dynamic data, the register at offset 0x08 contain a mix of static and dynamic data, registers at offsets 0xC, 0x10, 0x14 contain undefined data, the register at offset 0x18 contains a mix of static, dynamic and undefined data and the register at offset 0x1C consists entirely of dynamic data.

The mask value for each location is also shown in FIG. 2. If a bit location contains static data then the corresponding bit mask is set to 1, if the bit location contains dynamic or undefined data then the corresponding bit mask is set to 0.

In an embodiment the mask unit detects if the mask for a location is all zeroes. If so, the location is skipped. This reduces the time required for checking, e.g., reducing the amount of bus bandwidth required to perform the integrity check. Also reading unimplemented register space is avoided, which may generate a bus exception.

In this example a hash or checksum may be calculated by the processor from the following data:
The contents of offset 0x0 AND 0xFFFFFFFF
The contents of offset 0x8 AND 0xE000FFFF
The contents of offset 0x18 AND 0x00FF0000

An application programmer may set up the integrity check and define the mask. So he would be responsible for determining which bits of data should be included in the integrity check and what the valid programmed value for each of these bits should be. The mask file and the hash or checksum of the area to be checked can be generated from this information. A hash or checksum of the mask file may also be generated to prevent accidental or malicious alterations to the mask file.

Figure 3:
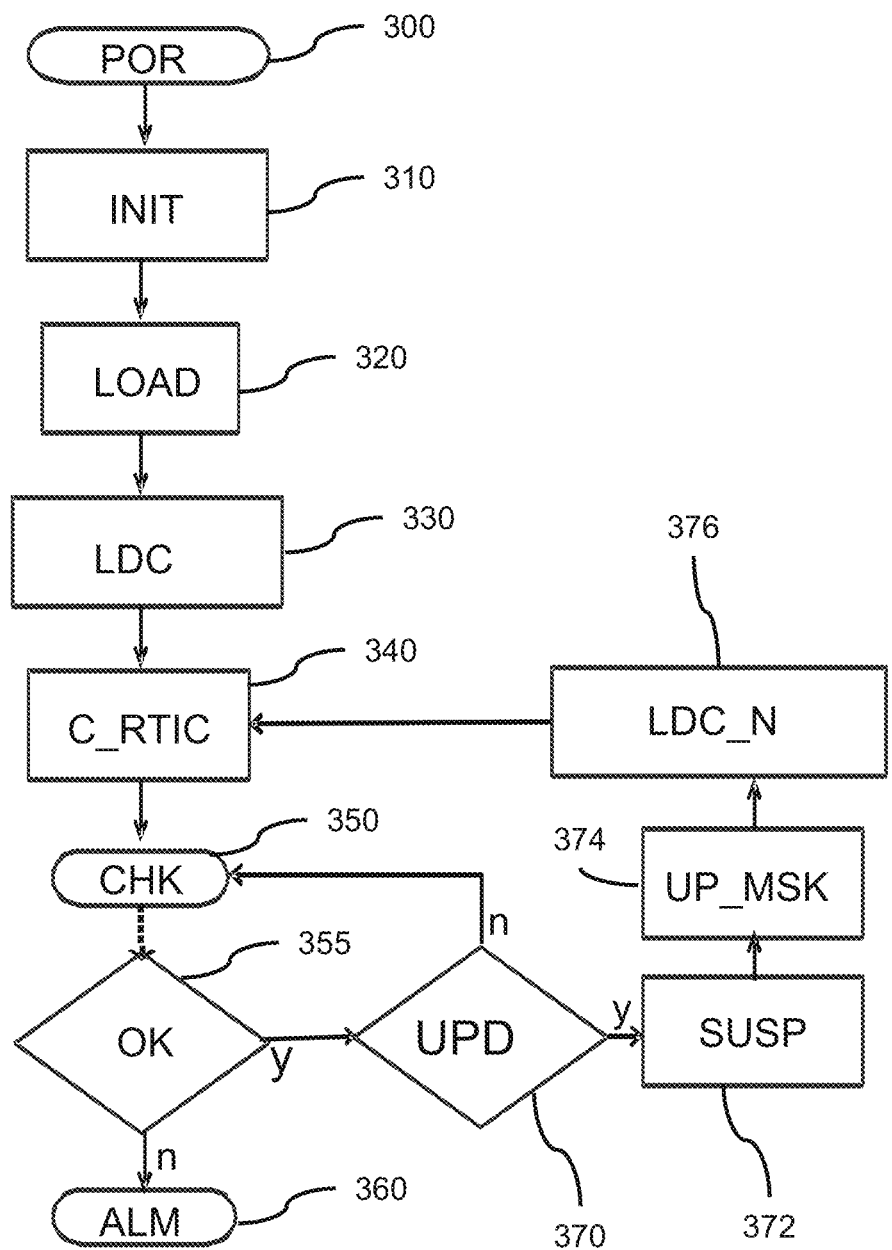
FIG. 3 shows an example of a method of runtime integrity checking.

FIG. 3 shows an example of a method of runtime integrity checking. The method is for monitoring contents of storage locations in an address range. The monitoring includes the following stages. In the address range to be tested the storage locations are selected by generating addresses within the address range for locations to be checked. Subsequently the locations to be checked are accessed via a bus interface using the addresses, and the contents from the locations to be checked are retrieved. The mask is processed for defining the locations to be checked based on bits in the mask. In the example of FIG. 3 the method includes an initialization sequence and starts at stage POR 300 performing a Power On Reset. Next, in stage INIT 310 the registers are initialized. Next, in stage LOAD 320 a mask file is loaded, e.g. retrieved from a memory via a bus interface and stored in a local mask memory of the mask unit. Next, in stage LDC 330, the method loads verification data like hash results or checksums that apply to the address ranges to be checked using the mask. Next, stage C_RTIC creates a runtime integrity checker descriptor, e.g., the parameters to be applied when running, such as address ranges, control data, specific test commands and applicable mask data. Various examples are described later. Next, in stage CHK 350, the runtime integrity checker is actually running and performing the integrity checks by retrieving data, applying the mask and further parameters from the descriptor, and proceeding along the address range. If a difference is detected in stage OK 355, the method proceeds via an output "n" and terminates at stage ALM 360 by generating an alarm signal. If no differences are detected the method proceeds via an output "y" to a new integrity check cycle. The new cycle may start at stage UPD by verifying whether an update of the registers will occur. If so, the method proceeds via an output "y" and suspends the runtime checking at a stage SUSP 372. Next, at stage UP_MSK 374, the mask is updated to comply with the new register contents and/or configuration. Next, at stage 376 LDC_N new verification data is loaded.

Initially an application may program memory or register blocks as usual, and then in the initialization sequence determine the mask file and the hash or checksums of the data area and mask file. The mask and verification data may then be supplied to the runtime integrity check module, for example through a descriptor. The runtime integrity checker module would then start the integrity check. While the application is running if a register update is required, e.g. an additional memory block is enabled, the integrity check may be suspended and new values for the mask file and hash or checksums may be loaded into the runtime integrity checker.

Figure 4:
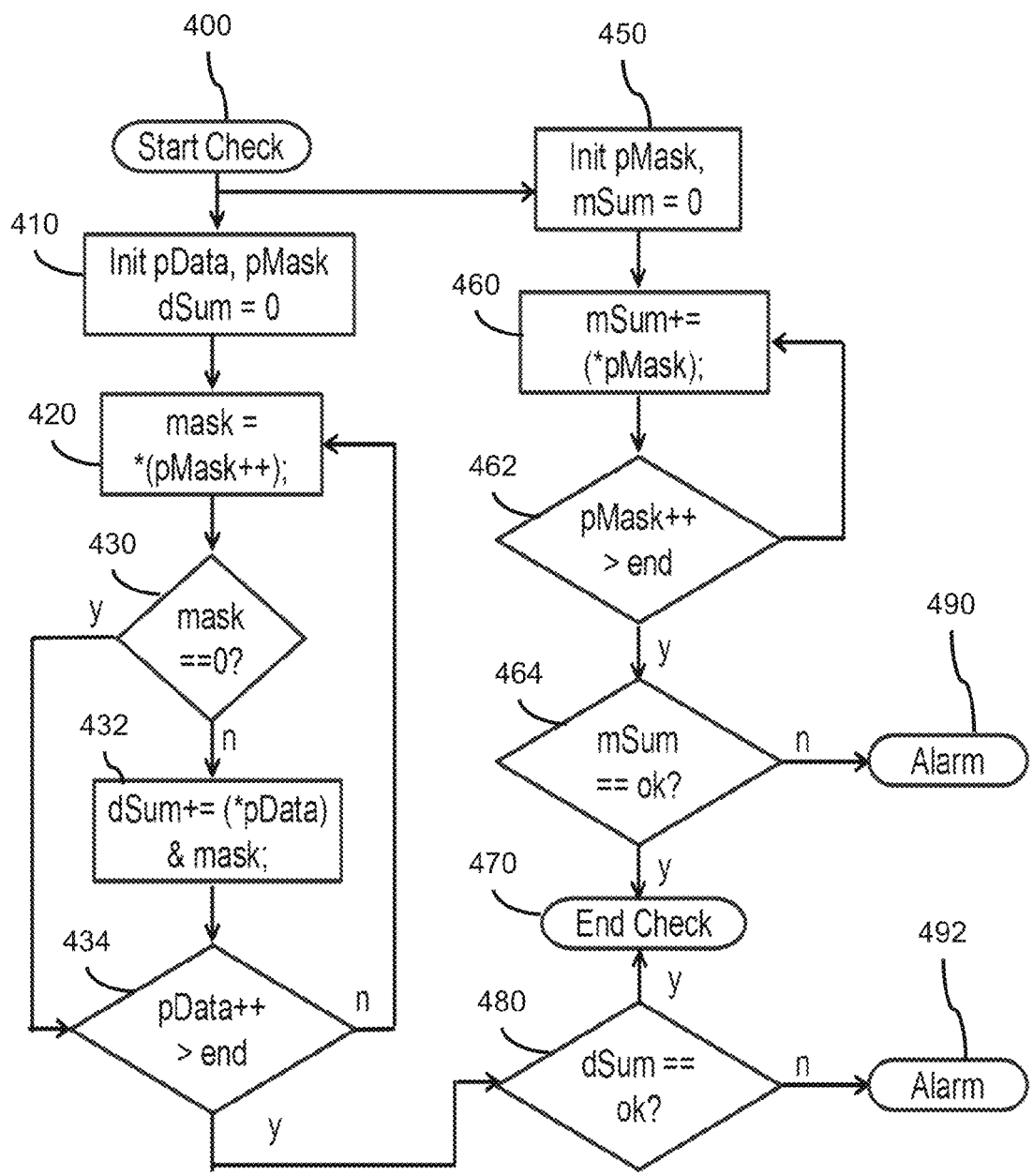
FIG. 4 shows an example of an integrity check.

FIG. 4 shows an example of an integrity check. In this example, for simplicity, a checksum is used however the same integrity check can be applied using a cryptographic hash. The check starts at Start Check 400. In a next stage 410 data and mask are initialized and the checksum is zeroed as expressed by "Init pData, pMask, dSum=0". Next, in the next stage 420 the mask is loaded, e.g. from a storage location as expressed by "mask=*(pMask++). In a next stage 430 a check is made to detect if the mask has only zeroes, e.g., indicating that each bit is not to be tested. If so, the location is skipped by proceeding to a test stage 434 otherwise stage 432 takes the data pointed to by pData and ANDs it with the mask and adds the result to the checksum. The test stage 434 increments the data pointer and determines whether the entire data region has been checked as expressed by "pData++>end". If the region has been fully checked, the resulting values are verified, e.g. the calculated checksum is compared to the stored checksum in test stage 480 as expressed by "dSum==ok?". If not, the method generates an alarm at stage Alarm 492.

Simultaneously, in a further parallel sequence, a check may be performed of the mask contents, starting at stage 450, where the mask and checksum are initialized as expressed by "Init pMask, mSum=0". In a next stage 460 the mask values are summed as expressed by "mSum+= (*pMask)". A next stage 462 increments the mask and determines whether the mask has been fully tested up to the end as expressed by "pMask++>end". If the mask has been fully tested, the resulting checksum or hash value is verified, e.g. a sum is determined and compared to a stored sum in test stage 464 as expressed by "mSum==ok?". If not, the method generates an alarm at stage Alarm 490. Check of register and mask contents may run concurrently or sequentially.

Further embodiments of the runtime integrity checker are now described, which allow to check both dynamic or mutable data and static data. Thereto the processor is arranged for processing a mutatable data descriptor that defines at least one condition for mutatable contents of a location to be checked, and for testing whether the contents of a location to be checked comply with the condition.

In an embodiment the mask constitutes one condition in the mutatable data descriptor (MDD). So the mask is included in the mutatable data descriptor. The mask unit may be arranged for retrieving the respective mask from the mutatable data descriptor.

Alternatively, the mask unit may be arranged for retrieving the respective mask for the mutatable data descriptor from a mask file. Here the mask and the MDD are separate data structures. So the mask comes from the mask file, each MDD has its own mask entry corresponding to its index in the mask file.

A first embodiment details how the runtime integrity checker can be used to check that dynamic data is according to an expected value. In a further embodiment the runtime integrity checker may be used in conjunction with the mask file to check non contiguous memory locations. For range search the table pointer can point to a list of Range Descriptor Rings (RDRs) or the RDRs can be chained in the MDD as shown in FIG. 6.

Figure 5:
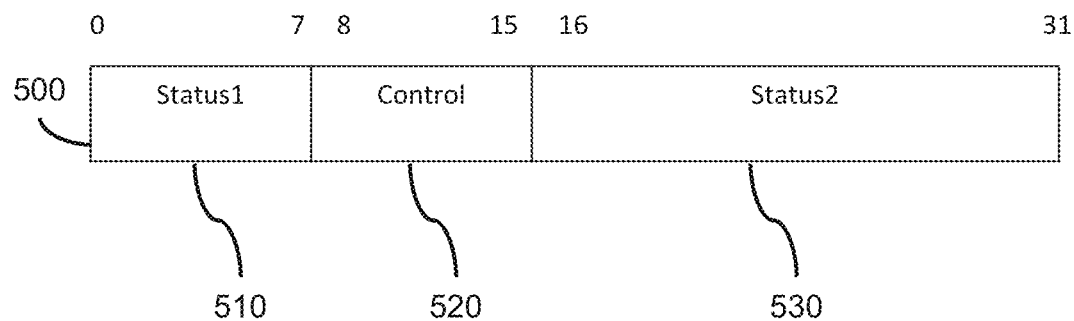
FIG. 5 shows an example of a register containing both dynamic or mutable data and static data.

FIG. 5 shows an example of a register containing both dynamic or mutable data and static data. In the example a 32 bit register is shown. The register contains 3 fields:
Field 510: Status1, occupying bits 0:7
Field 520: Control, occupying bits 8:15
Field 530: Status2, occupying bits 16:31

For example, the contents of Status1 may be required to be within a predetermined range. In an embodiment of the electronic device the processor is arranged for performing a range check. Then at least one condition in the mutatable data descriptor may comprise at least one value in the range, and the testing comprises testing whether the contents of a location to be checked are within the value range.

Figure 6:
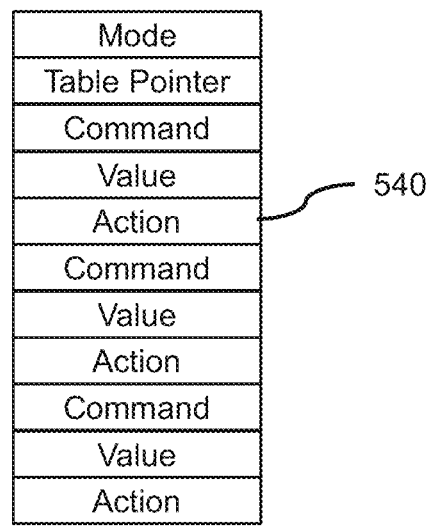
FIG. 6 shows an example of a mutatable data descriptor.

FIG. 6 shows an example of a mutatable data descriptor. The Figure shows a mutatable data descriptor (MDD) 540, having multiple fields defining the conditions to be tested. In the example the MDD has a Mode field defining the test mode, a Table Pointer field to refer to a Table containing a set of values to be tested, and then a few test command sequences, also called Range Descriptors. For range search the table pointer can point to a list of Range Descriptor Rings (RDRs) or the RDRs can be chained in the MDD as shown. Each test command sequence first has a Command field, followed by a Value and an Action field. The command field may indicate the type of value test (e.g. equal to, larger than, not equal to, etc.), while the action field may indicate that an alarm or exception is to be generated. The type of fields and commands are examples of properties and conditions to be tested. Other tests and fields may be added for other conditions to be tested. Further examples are described now.

In an embodiment, the mutatable data descriptor contains a mode field. The mode field may contain, for example, a mask increment control indicative of whether a mask file contains at least one further entry for a respective location to be checked. The mode field may contain a test mode indicative of a test to be performed.

In an embodiment the condition in the mutatable data descriptor may comprise a value set of one or more values. The processor is arranged for testing whether the contents of a location to be checked are in the value set.

In an embodiment the value set may be stored in a table. The processor may be arranged for generating a table pointer based on respective bits of the contents to be tested based on bits in the mask, and testing the contents by retrieving a value from the table based on the table pointer.

In an embodiment of the electronic device, the processor is arranged for retrieving a table pointer from the mutatable data descriptor, and testing the contents by retrieving at least one value from the value set based on the table pointer. As the MDD includes the table pointer, an amount of test data may be retrieved from the table. For example, a value set may comprise multiple values for a respective location to be tested. Also, the values in the table may be used from multiple MDD having the same table pointer.

In an exemplary embodiment, it is required to check that particular combinations of status 1 and status 2 do not occur, for example 50 or so error states that an application would wish to know if they occurred. A list of range checks is not efficient and may reduce performance. It is proposed to perform a look up. The user would program the MDD's data address to point to the location of the register to be tested as shown in FIG. 5, and programs the MDD's mode to be hash lookup. In the MDD's mask field the user would program the value 0xFF00FFFF, thus clearing the Control field. The runtime integrity checker hardware may then concatenate the Status1 and Status2 fields to form contiguous bits to be used as a look up key. For a limited number of bits and/or a large number of lookup values the contiguous bits may be directly used as lookup key.

In an embodiment the condition may include a table pointer condition indicating which bits of the respective bits of the contents are to be used for generating the table pointer. For example, using the above example of the register of FIG. 5, the 24 contiguous bits may be reduced by the table pointer condition, which may indicate that only the first 8 bits are to be used as a key. So the MDD may contain a field which states how many of the 24 bits are to be used in the look up and which of the bits are to be used.

In an embodiment the processor is arranged for generating the table pointer by performing a polynomial calculation on respective bits of contents of a location to be checked, the table pointer having less bits than the number of bits of the contents to be tested. The processor is further arranged for testing the contents by retrieving a value from the table based on the table pointer. In practice the runtime integrity checker hardware may run a polynomial calculation (CRC, cryptographic) on the look up key that yields a smaller number of bits, while being mathematically distributed to mitigate collisions. The result is used as the lookup index. For example, if the final number of bits is 10, this gives 1024 possible combinations. For using a large, combined lookup table the hardware may take the MDDs table pointer field and add to this the look up index multiplied by the table entry size. In an exemplary lookup hash table, at each index there are multiple exact match values which the runtime integrity checker hardware compares to the 24 bit look up key. The multiple entries may be provided as the 24 bits has been reduced to a 10 bit index, so different values of the look up key may yield the same index. If a match occurs then in this example an alarm will be raised. If no match is found then in this case no alarm will be raised.

In an embodiment multiple MDD's, which check different registers, may use the same hash table.

In alternative embodiments the mode field could contain a mask increment control. The mask file may contain multiple entries for the same address being checked. In the example above Status1 and Status2 may be independent. So the first mask for this MDD could be configured to 0xFFFF (Status2) for a hash lookup. The mode states index the mask but not the MDD so we use another mask for the hash lookup from the same MDD. This time the mask would be 0xFF (Status1). Also, the Mode may contain a checksum that increments a register in the runtime integrity checker. This could be used to implement the checks for static data.

The MDDs may contain a cyclic list of descriptors, and can be run continuously or triggered periodically via a timer. This allows non contiguous memory to be checked at different locations on the device, e.g. registers, DDR, FIFOs, internal SRAM etc. As descriptors are used we can have a smaller mask. This is because the MDDs point directly to the locations being checked rather than using a full mask to skip over reserved or unimportant locations to the application within the register space or address range being checked.

Figure 7:
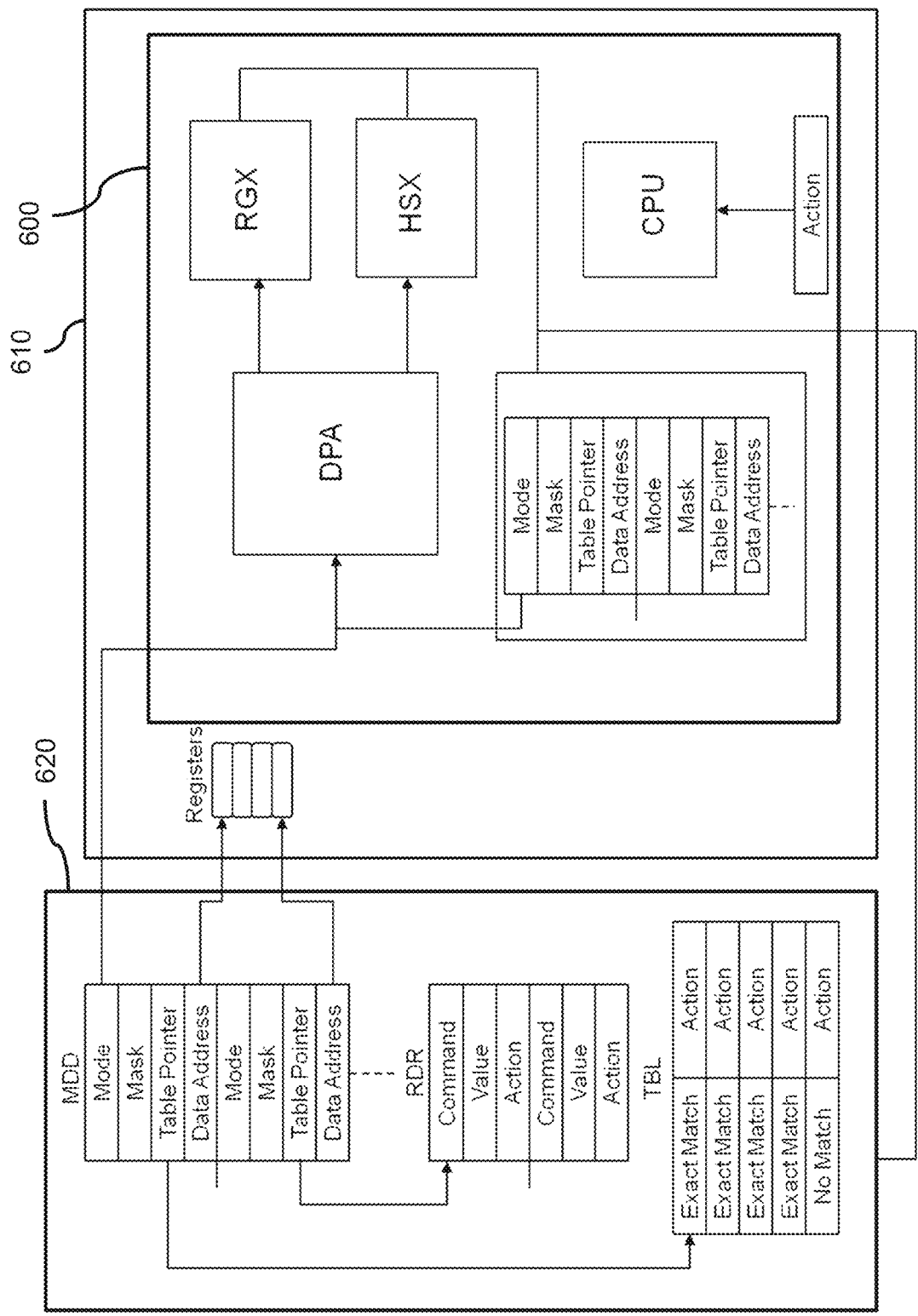
FIG. 7 shows an example of a system including a runtime integrity checker.

FIG. 7 shows an example of a system including a runtime integrity checker. The runtime integrity checker 600 is shown as being embedded in an electronic device 610 having a number of registers that are to be monitored during runtime. The electronic device 610 may for example be implemented as a microprocessor, such as a general purpose microprocessor, a microcontroller, a digital signal processor or other suitable type of microprocessor. The microprocessor may for example comprise one, two or more central processing units (CPU) or cores. Additionally, the microprocessor may comprise one or more peripherals, such as hardware accelerators, co-processors or otherwise, and/or memory, such as on-chip flash or RAM. The microprocessor may likewise comprise a system bus or other communication connection between allowing the components to exchange data. An external memory 620 is coupled to the electronic device and contains a mask file. The runtime integrity checker comprises a mask unit, also called a description parser DPA. The DPA is coupled to the external memory and to an internal memory for retrieving and storing relevant parts of the mask file. The mask file may contain mutatable data descriptors MDD, a ring of data range definitions RDR, and/or tables TBL for defining the monitoring actions to be performed as elucidated above with FIG. 6. The DPA is further coupled to one or more processor units, for example a range monitoring execution unit RGX and a hash execution unit HSX as shown. The processor unit or cooperating units perform the monitoring actions as defined in the mask file, the MDD, the RDR and TBL data structures. A central processing unit CPU may be part of the electronic device or the runtime integrity checker, and may for example may receive an alarm message generated by an Action during runtime integrity checking, e.g. an Interrupt, Fail Safe message, or a Write To Memory message.

In the example as shown in FIG. 7 the MDD has the fields: Mode; Mask; Table Pointer; Data Address. After that a next MDD starts. For example, the Mode field may indicate a Range check by a value 0 and a hash function by a value 1. The Mask field may contain the respective mask bits for the storage location to be tested. The Table Pointer field may point to a first range descriptor in the RDR. In the example the range descriptor RD has the fields: Command, Value, Action. After that a next RD starts. The Command field may for example indicate a type of test by a respective binary value, such as Equal by 000, Less Than by 001, Less Than Or Equal by 010, Greater Than by 011, Greater Than Or Equal by 100, etc. The Value field may contain the value to be compared with the value of the storage location. The Action field may have a subfield indicating an Alarm Action by a binary value, such as Disable Alarm by 00, Alarm If Command Is True by 01 or Alarm If Command Is False by 10. A second subfield indicating a Next Action by a binary value, such as Return by 00, Next Range Descriptor by 01, Return If True—Next If False, Return If False—Next If True, etc.

In a practical example, using the above defines values for the fields, the following test can be encoded. A 16 bit field in a 32 bit storage location at 0xA000 must be monitored to be within the range 3-1500 or 2000-16000. This can be accomplished using four value checks: the first would check that the value is less than or equal to 16000, the next would check that the value is greater than or equal to 3, the third would check that the value is less than or equal to 1500 and the final check would that the value is greater than or equal to 2000. Failing any of these checks in order would indicate that the value is out of the allowable ranges. The MDD would then be: 0x0; 0xFFFF0000; Table Pointer to RDR entry; 0xA000. The first RD at the RDR entry would be: 0b001; 3; 0b01; 0b01. Next RD: 0b011; 16000; 0b01; 0b01. Next RD: 0b010; 1500; 0b00; 0b01. Next RD: 0b100; 2000; 0b10; 0b00.

The Table Pointer may alternatively point to an entry in the table TBL. The type of Table Pointer may be controlled via the Mode field. The TBL may be a Hash Table defining a type of test, like Exact Match or No Match, and an Action to be performed when the condition is found in the respective storage location that is being tested. The Action may be indicated by a respective binary value, for example Return by 0; Alarm by 1. The Table Pointer may indicate the start of the Hash Table, while the actual address in the Hash Table may be indicated by a sum of the Table Pointer and a calculated Hash of the respective bits at the storage location, masked or reduced as elucidated above.

For operational use during runtime monitoring the respective parts of the mask file may be stored in the internal memory of the runtime integrity checker. The above system may involve using a combination of a mask and descriptor file, a range search and/or exact match table with actions to handle the run time integrity checking of mutable data within a system or device. Hardware may read a mask file and use the mask to selectively mask fields within a register or memory to extract a look up key. Hardware may concatenate and shift the unmasked bits extracted to generate a contiguous stream of bits in a look up key. The hardware may support range checking, exact match and hash based exact match, and may be capable of handling a chain of range descriptors. The hardware may perform an exact match check using a hash based index look up, and may generate an alarm upon encountering out of range or hash look up miss or match.

In an embodiment having the same structure as described above with reference to FIG. 7, the MDD may have the fields: Mode; Table Pointer; Command; Value; Action. After that a next MDD starts. For example, the Mode field may indicate in a first subfield Range/Hash: a Range check by a value 0 as described above and a direct hash pointer by a value 1. In a second subfield Mask Increment: by value 0 "Increment mask pointer and address check pointer" and by a value 1 "Increment mask pointer" only. The mask for this storage location may be retrieved from a separate mask file defining the address and/or bits of the storage location to be tested. The Table Pointer field may point directly to a Hash Table. The Command field may for example indicate a type of test by a respective binary value, such as Equal by 000, Less Than by 001, Less Than Or Equal by 010, Greater Than by 011, Greater Than Or Equal by 100, etc. The Value field may contain the value to be compared with the value of the storage location. The Action field may have a subfield indicating an Alarm Action by a binary value, such as Disable Alarm by 00, Alarm If Command Is True by 01 or Alarm If Command Is False by 10. A second subfield indicating a Next Action by a binary value, such as Return by 00, Next Range Descriptor by 01, Return If True—Next If False, Return If False—Next If True, etc.

Figure 8:
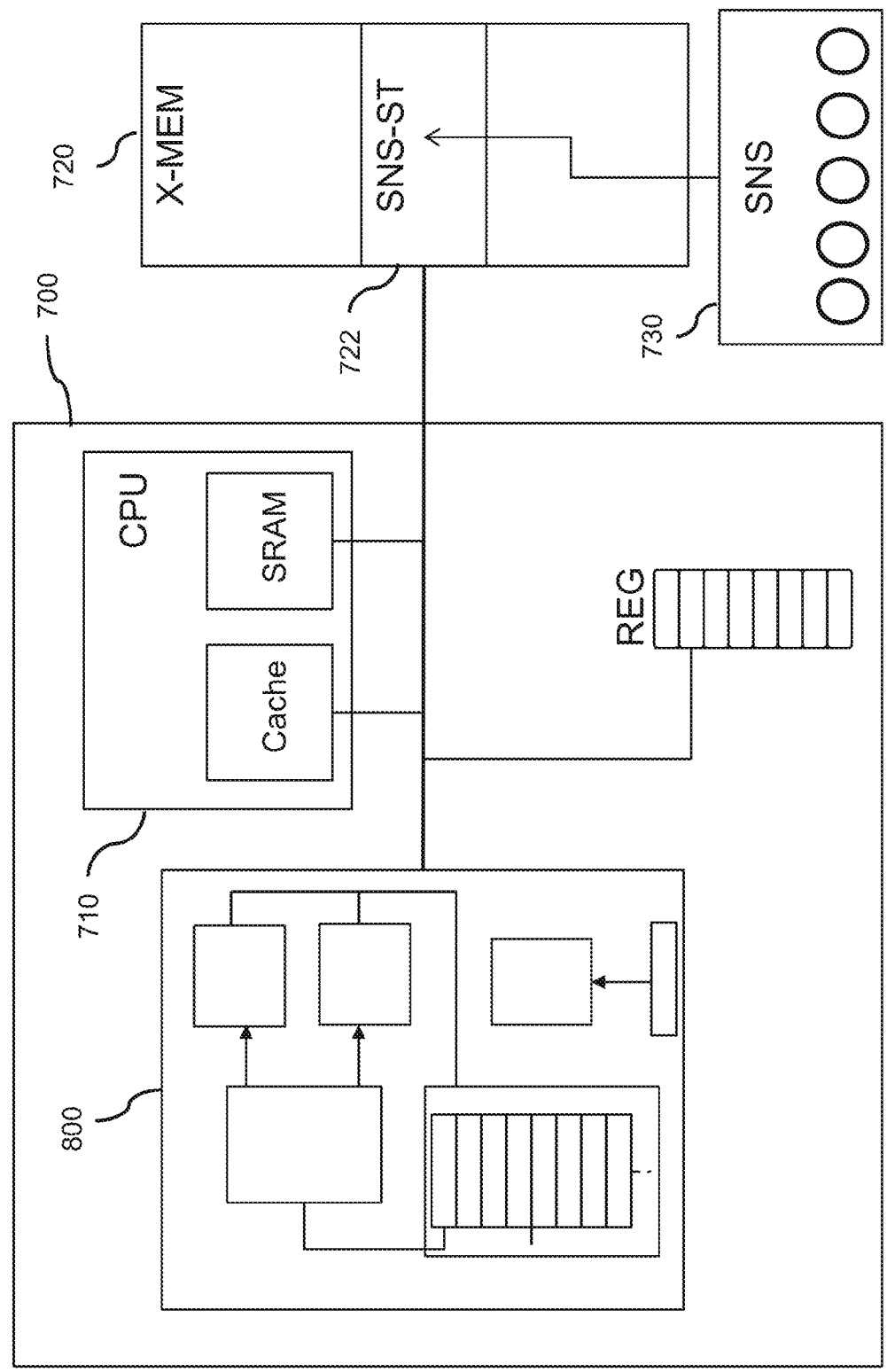
FIG. 8 shows an example of a secure information processing system.

FIG. 8 shows an example of a secure information processing system. The secure information processing system has an electronic device 700, also called a controller, comprising an integrated circuit 800 that comprises the runtime integrity checker as described above with reference to FIG. 7. The controller has a processor unit CPU 710 having a local memory, for example a Cache memory and an SRAM memory. The controller may have a set of registers REG that may be monitored via the runtime integrity checker as elucidated above. In a further example the electronic device 700 may be embedded in an integrated circuit containing at least the runtime integrity checker as described above, the processor unit CPU 710 and the set of registers REG.

The secure information processing system may further have an external memory address range X-MEM 720 which address range may have contiguous areas of memory, non contiguous memory storage locations and other addressable elements, such as storage locations SNS-ST 722 having sensor state values. The sensor state values may be externally provided and directly written from sensors coupled via a sensor unit 730, for example a sensor DAC/ADC or aggregator. The runtime integrity checker may be configured, via the mask file and possible further mutatable data descriptors to monitor, during runtime, the values of various storage locations in the secure information processing system, such as the registers REG, areas and/or locations in the range X-MEM, and/or locations in the SRAM of the CPU.

In practice, various systems may benefit from having run time checking on values that are important but not critical. The proposed runtime integrity checker presents a cost effective method of improving system fault tolerance and increasing system monitoring without needing targeted hardware for each parameter that the user would ideally monitor. The runtime integrity checker may have the ability to check mutable and static fields, and to check non-contiguous fields from different sources. Advance warnings can easily be generated without the need of dedicated hardware. For example if a sensor is almost out of range or in a dangerous but not critical range of values, and/or a state machine in a register is at certain state or states, this may generate an advance warning without dedicated hardware coupling each state. Further system software could, upon receiving the alarm or warning from the runtime integrity checker, perform an appropriate action such as pre-empt fail safe or recovery or escalate monitoring. In a further example, the runtime integrity checker may be used to start up a redundant system. Such a system may be in an inert condition, and the runtime integrity checker may be used to wake up the redundant unit ahead of a critical state being reached. Also, the runtime integrity checker minimizes the amount of fields to be checked as non-contiguous locations can be monitored, which does consume less bus bandwidth.

In the foregoing specification, the invention has been described with reference to specific examples of embodiments of the invention. It will, however, be evident that various modifications and changes may be made therein without departing from the broader spirit of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Furthermore, the units and circuits may be suitably combined in one or more semiconductor devices.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. Electronic device having a runtime integrity checker for monitoring contents of storage locations in an address range, the runtime integrity checker comprising:
    a location selector for selecting the storage locations by generating addresses within the address range for locations to be checked,
    an interface unit coupled to the location selector for receiving the addresses for accessing the locations to be checked via a bus interface,
    a processor coupled to the interface unit for retrieving the contents from the locations to be checked, and
    a mask unit for processing a mask coupled to the location selector for defining the locations to be checked based on bits in the mask, wherein the locations to be checked consists of data that is not expected to change during runtime of the electronic device, and wherein locations that are not checked consists of data that is expected to change during runtime of the electronic device.

2. Electronic device as claimed in claim 1, wherein the mask unit is coupled to the location selector for defining the locations to be checked by providing the addresses of the locations to be checked based on bits in the mask.

3. Electronic device as claimed in claim 1, wherein the mask unit is coupled to the processor for defining the locations to be checked by defining respective bits of contents of a location to be checked based on bits in the mask.

4. Electronic device as claimed in claim 3, wherein the mask is indicating for respective bits of a location to be checked whether the respective bit is to be tested or ignored and the mask unit is arranged for testing only the respective bits of the contents based on the mask.

5. Electronic device as claimed in claim 1, wherein the mask is indicating that a respective location in an address range of locations to be tested does not contain any bits to be tested and the mask unit is arranged for skipping the respective storage location based on the mask.

6. Electronic device as claimed in claim 1, wherein the processor is arranged for processing a mutatable data descriptor that defines at least one condition for mutatable contents of a location to be checked, and for testing whether the contents of a location to be checked comply with the condition.

7. Electronic device as claimed in claim 6, wherein the mask constitutes one condition in the mutatable data descriptor, and the mask unit is arranged for retrieving the respective mask from the mutatable data descriptor, or for retrieving the respective mask for the mutatable data descriptor from a mask file.

8. Electronic device as claimed in claim 6, wherein the at least one condition comprises at least one value range, and the testing comprises testing whether the contents of a location to be checked are within the at least one value range.

9. Electronic device as claimed in claim 6, wherein the at least one condition comprises a value set of one or more values, and the testing comprises testing whether the contents of a location to be checked are in the value set.

10. Electronic device as claimed in claim 9, wherein the value set is stored in a table, and the processor is arranged for generating a table pointer based on respective bits of the contents to be tested based on bits in the mask, and testing the contents by retrieving a value from the table based on the table pointer.

11. Electronic device as claimed in claim 10, wherein the at least one condition comprises a table pointer condition indicating which bits of the respective bits of the contents are to be used for generating the table pointer.

12. Electronic device as claimed in claim 9, wherein the processor is arranged for retrieving a table pointer from the mutatable data descriptor, and testing the contents by retrieving at least one value from the value set based on the table pointer.

13. Electronic device as claimed in claim 9, wherein processor is arranged for
generating the table pointer by performing a polynomial calculation on respective bits of contents of a location to be checked, the table pointer having less bits than the number of bits of the contents to be tested and
testing the contents by retrieving a value from the table based on the table pointer.

14. Electronic device as claimed in claim 9, wherein the value set comprises multiple values for a respective location to be tested.

15. Electronic device as claimed in claim 6, wherein the mutatable data descriptor contains a mode field, the mode field containing at least one of
a mask increment control indicative of whether a mask file contains at least one further entry for a respective location to be checked;
a test mode indicative of a test to be performed.

16. Electronic device as claimed in claim 1, wherein the mask unit is coupled to the interface unit for receiving a mask file for retrieving the mask.

17. Electronic device as claimed in claim 16, wherein runtime integrity checker comprises a mask decompress unit for decompressing a mask file to retrieve the mask.

18. Integrated circuit comprising at least one electronic device according to claim 1.

19. Secure information processing system comprising at least one electronic device according to claim 1, and a storage unit having the storage locations to be tested coupled to the interface unit via the bus interface.

20. Method of monitoring contents of storage locations in an address range of a processor,
the monitoring comprising:
selecting the storage locations by generating addresses within the address range for locations to be checked,
accessing the locations to be checked using the addresses,
retrieving the contents from the locations to be checked, and
processing a mask for defining the locations to be checked based on bits in the mask, wherein the locations to be checked consists of data that is not expected to change during runtime of the processor, and wherein locations that are not checked consists of data that is expected to change during runtime of the processor.

* * * * *